United States Patent
Jung et al.

(10) Patent No.: US 11,521,679 B2
(45) Date of Patent: Dec. 6, 2022

(54) MEMORY DEVICE FOR CANCELING SNEAK CURRENT

(71) Applicant: UIF (University Industry Foundation), Yonsei University, Seoul (KR)

(72) Inventors: Seong Ook Jung, Seoul (KR); Tae Hyun Kim, Seoul (KR); Byung Kyu Song, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 0 days.

(21) Appl. No.: 17/338,333

(22) Filed: Jun. 3, 2021

(65) Prior Publication Data

US 2021/0383864 A1 Dec. 9, 2021

(30) Foreign Application Priority Data

Jun. 4, 2020 (KR) .......................... 10-2020-0067560

(51) Int. Cl.
*G11C 11/00* (2006.01)
*G11C 13/00* (2006.01)

(52) U.S. Cl.
CPC ........ *G11C 13/004* (2013.01); *G11C 13/0026* (2013.01); *G11C 13/0004* (2013.01)

(58) Field of Classification Search
CPC .............. G11C 13/004; G11C 13/0026; G11C 13/0004
USPC ....................................................... 365/148
See application file for complete search history.

(56) References Cited

U.S. PATENT DOCUMENTS

| 6,529,398 B1* | 3/2003 | Nair ........................ G11C 11/22 365/189.09 |
| 6,885,579 B2* | 4/2005 | Sakimura ................ G11C 11/15 365/158 |
| 6,914,839 B2* | 7/2005 | Chow ..................... G11C 11/22 365/207 |
| 8,953,363 B2* | 2/2015 | Shimakawa ......... G11C 13/004 365/175 |
| 9,183,916 B2 | 11/2015 | King Liu et al. |
| 2004/0004856 A1 | 1/2004 | Sakimura Noboru et al. |

FOREIGN PATENT DOCUMENTS

| KR | 20190140721 A | 12/2019 |
| KR | 102061694 B1 | 1/2020 |

OTHER PUBLICATIONS

Taehui Na et al., "Offset-Canceling Single-Ended Sensing Scheme With One-Bit-Line Precharge Architecture for Resistive Nonvolatile Memory in 65-nm CMOS", IEEE Transactions on Very Large Scale Integration (VLSI) Systems, vol. 27, No. 11, Nov. 2019, pp. 2548-2555.

* cited by examiner

*Primary Examiner* — Vu A Le

(57) ABSTRACT

Disclosed is a memory device for cancelling a sneak current. The memory device according to the exemplary embodiment of the present disclosure includes a memory cell array which includes a plurality of word lines and a plurality of bit lines intersecting each other and memory cells disposed at intersections of the word lines and the bit lines; and a sensing circuit which supplies a bit line current to all or some of the bit lines, cancels a sneak current based on the bit line current by at least one switching control, and senses and amplifies data stored in the memory cell to output the sensed and amplified data.

10 Claims, 21 Drawing Sheets

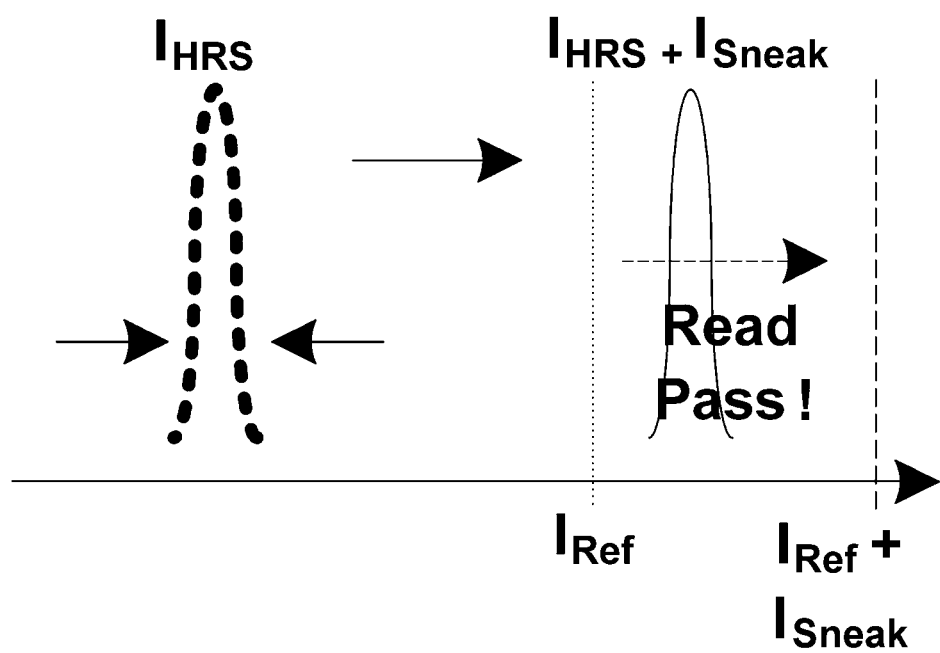

MEMORY DEVICE FOR CANCELING SNEAK CURRENT

CROSS-REFERENCE TO RELATED APPLICATIONS

This application claims priority to and the benefit of Korean Patent Application No. 10-2020-0067560 filed in the Korean Intellectual Property Office on Jun. 4, 2020, the entire contents of which are incorporated herein by reference.

BACKGROUND

Technical Field

The present disclosure relates to a memory device which operates by sampling a sneak current and canceling the sampled sneak current. This work was supported in part by the Ministry of Trade, Industry and Energy under Grant 10080590, in part by the Korea Semiconductor Research Consortium Support Program for the Development of the Future Semiconductor Device (NO. K_G011008059005).

Description of the Related Art

The contents described in this section merely provide background information on the exemplary embodiment of the present disclosure, but do not constitute the related art.

A DRAM is a volatile memory which has a fast processing speed, but cannot permanently store data and a NAND flash memory has a non-volatility, but has a slow processing speed. A resistive random access memory (also, referred to as a RRAM) is a memory with a new structure which is expected to have both a fast processing speed of the DRAM and a non-volatility of the NAND flash and have a high capacity beyond both the DRAM and NAND flash.

According to an operating principle of the RRAM, data is stored by means of a resistance by allowing an element to be in a high resistance state or a low resistance state.

Among the RRAM, as compared with an RRAM which imitates a structure of the existing DRAM to have a unit memory cell with one transistor and one resistor (1T1R) structure, a crossbar RRAM having a unit memory cell with one selector and one resistor (1S1R) structure is expected to drastically increase a capacity.

However, in the case of the crossbar RRAM, a current which flows through an unselected cell cannot be perfectly controlled due to an incomplete switch characteristic so that it has a sneak current problem which flows through an unselected cell. Specifically, the sneak current causes a serious problem when a read operation of data stored in the memory is performed.

In order to read data stored in the RRAM, after applying a predetermined voltage to a selected cell, a current which flows through the selected cell is sensed to determine a resistance of the corresponding cell. However, in this case, not only the current flowing through the selected cell, but also a current (a sneak current) flowing through the unselected cell is sensed so that exact data cannot be read.

A magnitude of the sneak current is proportional to a capacity of the RRAM and in order to suppress the data read error, the sneak current needs to be reduced by reducing the capacity so that the sneak current makes it difficult to make an RRAM with a large capacity.

As a general read scheme for a crossbar RRAM, a floating read scheme which select only one cell by applying voltages (a read voltage VR and a sensing voltage VSS) to only one bit line and one word line is used.

However, in order to reduce a data read error due to the sneak current, a new read scheme specified to the RRAM has been proposed. Among them, as a representative scheme, there is a V/2 read scheme which applies half the voltage ((VR−VSS)/2) to all unselected beat lines and word lines, differently from the floating read scheme. Even though in the floating read scheme, the sneak current flowing through all unselected cells is added to the current of the selected cell to be sensed, according to the V/2 read scheme, only a current flowing through cells connected to the bit line to which the VR is applied is added to the current of the selected cell to be sensed. Therefore, it is advantageous in that an amount of sneak current which is undesirably sensed is reduced, but it is disadvantageous in that a consumed power is several tens of times larger than that of the floating read scheme.

According to both the schemes, the read voltage VR and the sense voltage VSS are applied to the selected bit line and word line to sense a current flowing to a point (a read point) applied with a sensing voltage to read data stored in the selected cell.

According to the VR read scheme, in order to reduce a sneak current flowing into a sensing point, VR/2 is applied to all bit lines and word lines which are not selected, to allow only the sneak current flowing through cells connected to the selected bit line to flow into the read point. Accordingly, the remaining cells which are connected to the selected word lines do not affect the read operation so that the influence of the sneak current is comparatively reduced. However, since a forward bias is applied to these cells so that a lot of current flows, according to the V/2 read scheme, the power consumption is large.

In contrast, according to the floating read scheme, a voltage is not applied to all unselected bit lines and word lines, but the unselected bit lines and word lines are floated, so that a reverse current which is significantly smaller than the forward current is applied to all the unselected cells, thereby significantly reducing the power consumption. However, all the reverse current flowing through all the unselected cells is sensed at the read point, so that a possibility of causing a data read error may be increased.

SUMMARY

A main object of the present disclosure is to provide a memory device which samples a sneak current using a dummy cell by a first switching control step and cancels the sampled sneak current by a second switching control step to cancel a sneak current which reads data stored in the memory cell.

According to an aspect of the present disclosure, in order to achieve the above-described object, a memory device includes: a memory cell array which includes a plurality of word lines and a plurality of bit lines intersecting each other and memory cells disposed at intersections of the word lines and the bit lines; and a sensing circuit which supplies a bit line current to all or some of the bit lines, cancels a sneak current based on the bit line current by at least one switching control, and senses and amplifies data stored in the memory cell to output the sensed and amplified data.

As described above, according to the present disclosure, a problem in that a read failure in a read operation is increased due to the sneak current in a cross-point array structure can be solved.

Further, according to the present disclosure, a problem in that read failure is increased due to an offset voltage in a sensing circuit of a memory device may be solved.

Further, according to the present disclosure, the sneak current is identified without using a current mirror so that the sneak current may be exactly identified without causing a sneak current variation due to threshold voltage mismatching (Vth mismatch) of a current mirror.

Further, according to the present disclosure, in a reference current and read current generating and transmitting path, a sensing circuit is configured using the same transistor so that the read failure probability of a voltage variation in the reference current and read current path may be significantly reduced.

BRIEF DESCRIPTION OF THE DRAWINGS

FIG. 3A and FIG. 3B are a view illustrating an operating step of a memory device according to an exemplary embodiment of the present disclosure;

DETAILED DESCRIPTION OF THE EMBODIMENT

Hereinafter, exemplary embodiments of the present disclosure will be described in detail with reference to the accompanying drawings. In the description of the present disclosure, if it is considered that the specific description of related known configuration or function may cloud the gist of the present disclosure, the detailed description will be omitted. Further, hereinafter, exemplary embodiments of the present disclosure will be described. However, it should be understood that the technical spirit of the invention is not restricted or limited to the specific embodiments, but may be changed or modified in various ways by those skilled in the art to be carried out. Hereinafter, a memory device for cancelling a sneak current which is proposed by the present disclosure will be described in detail with reference to the drawings.

Figure 1A:
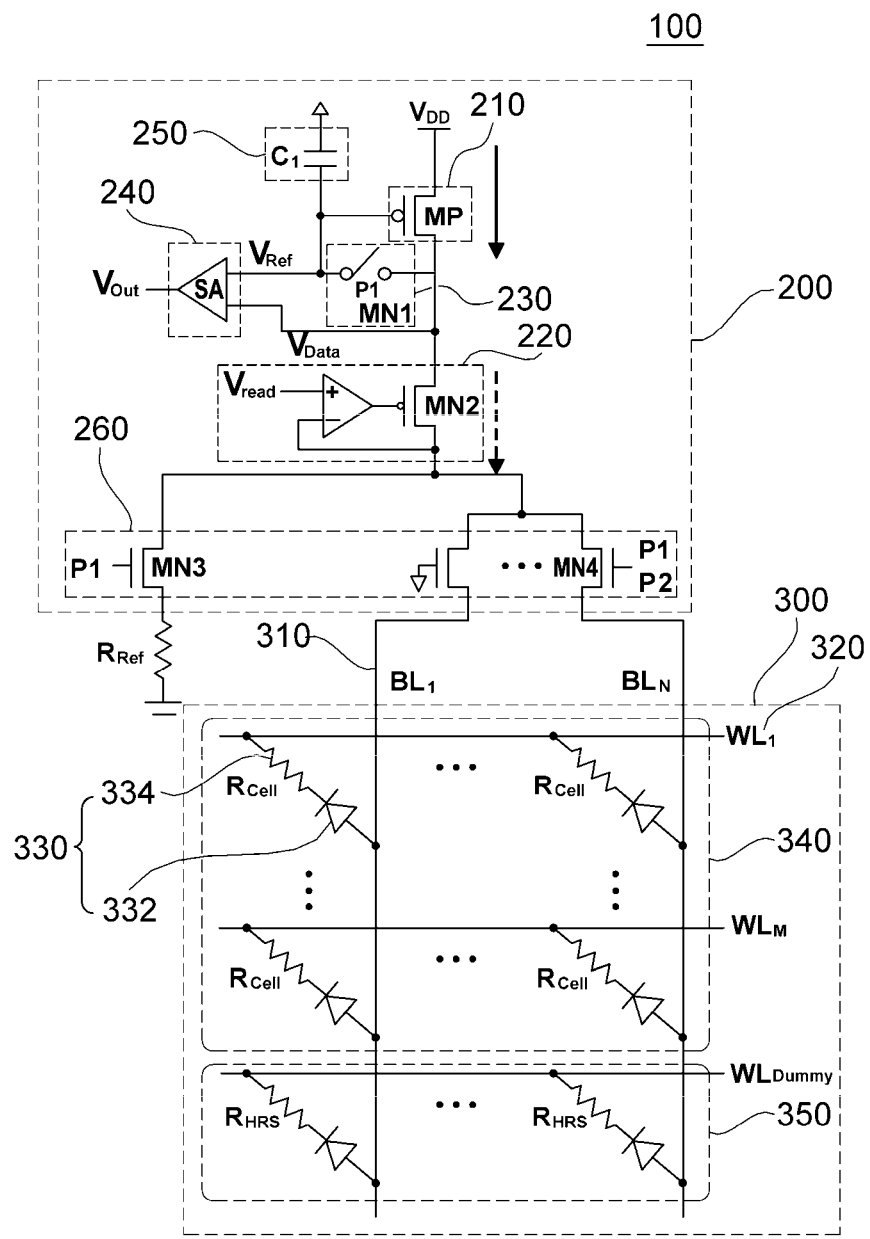
FIG. 1A and FIG. 1B are a view illustrating a memory device according to an exemplary embodiment of the present disclosure.
Figure 1B:
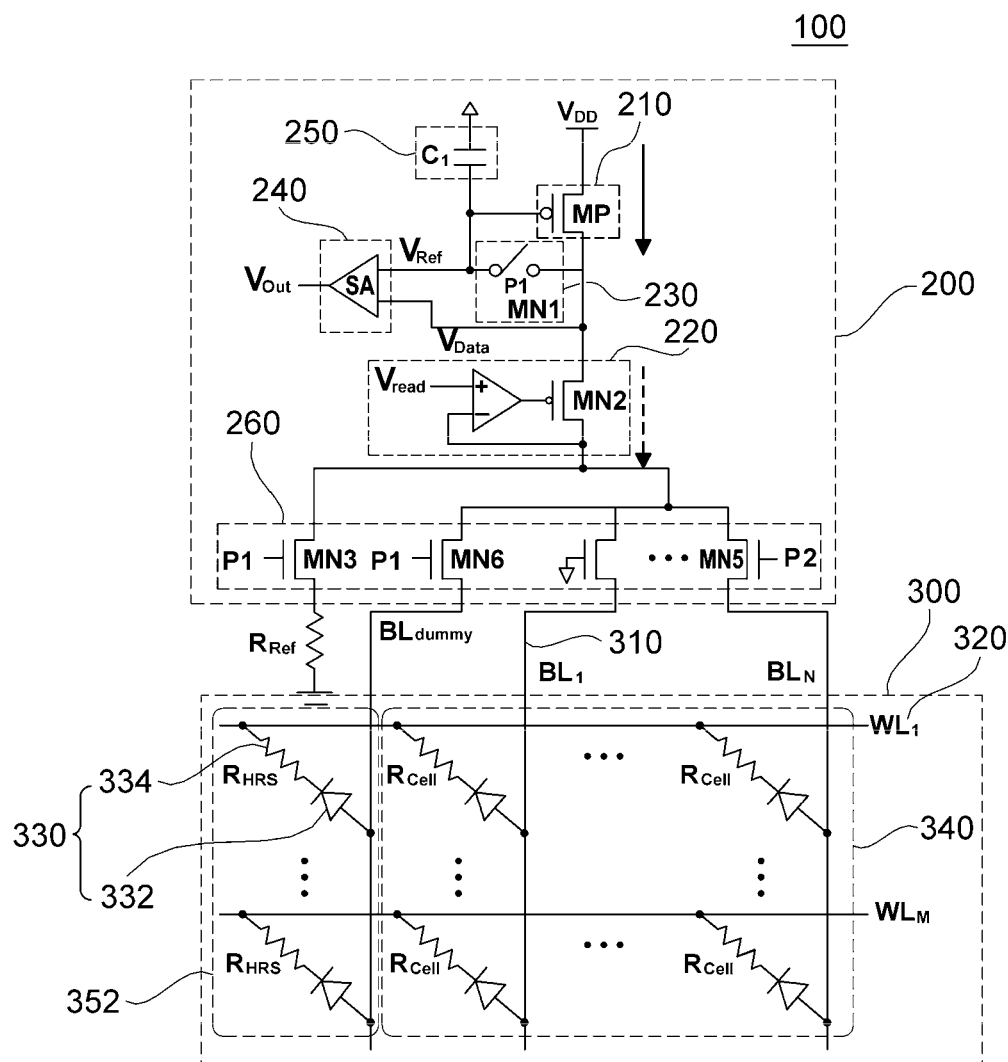

FIG. 1A and FIG. 1B are a view illustrating a memory device according to an exemplary embodiment of the present disclosure.

A memory device 100 according to the present exemplary embodiment includes a sensing circuit 200 and a memory cell array 300. The memory deice 100 further includes a power source and a memory controller which interwork with the sensing circuit 200 and the memory cell array 300 and operates similarly to a general memory device so that a description thereof will be omitted. The memory device 100 of FIG. 1A is an example so that all blocks illustrated in FIG. 1A are not essential components and in the other exemplary embodiment, some blocks included in the memory device 100 may be added, modified, or omitted.

The sensing circuit 200 performs an operation of supplying a bit line current to all or some of the bit lines of the memory cell array 300, cancelling a sneak current based on the bit line current by at least one switching control, and sensing and amplifying data stored in a memory cell 330 to output the sensed and amplified data.

The sensing circuit 200 according to the present exemplary embodiment may be configured by a current generating circuit 210, a clamping circuit 220, a first switch circuit 230, a sense amplifier 240, a sampling capacitor 250, and a bit line selecting circuit 260. The sensing circuit 200 of FIG. 1A is an example so that all components illustrated in FIG. 1A are not essential components and in another exemplary embodiment, some components included in the sensing circuit 200 may be added, modified, or omitted.

In the sensing circuit 200, one end of the current generating circuit 210 is connected to the other end of the clamping circuit 220 and a contact between the current generating circuit 210 and the clamping circuit 220 is connected to the sense amplifier 240. Here, a first switch circuit 230 may be connected between the contact between the current generating circuit 210 and the clamping circuit 220 and the sense amplifier 240. Here, the first switch circuit 230 may be a transistor MN1 which performs a switching operation by a first operation control signal P1.

Further, in the sensing circuit 200, a contact between the sense amplifier 240 and the first switch circuit 230 is connected to a sampling capacitor 250 and the sampling capacitor 250 may be connected to the ground.

Further, a contact between the contact between the sense amplifier 240 and the first switch circuit 230 and the sampling capacitor 250 may be connected to the current generating circuit 210.

Further, the clamping circuit 220 is connected to a bit line selecting circuit 260. Here, the bit line selecting circuit 260 may include a second switch circuit MN3 and a third switch circuit MN4. Here, the second switch circuit MN3 may be a transistor MN3 which is connected to a reference resistor Rref and performs a switching operation by the first operation control signal P1. The third switch circuit MN4 may be a transistor MN4 which is connected to a plurality of bit lines BL1 to BLN and performs a switching operation by a second operation control signal P2. In FIG. 1A, even though the third switch circuit MN4 is illustrated as one switch circuit, the present exemplary embodiment is not limited thereto so that the switch circuits may be implemented with the same number as the number of the plurality of bit lines BL1 to BLN.

In the meantime, even though the bit line selecting circuit 260 included in the sensing circuit 200 is described as a component included in the sensing circuit 200, it is not necessarily limited thereto and may be implemented by a separate bit line column selecting circuit located between the sensing circuit 200 and the memory cell array 300.

The memory cell array 300 according to the present exemplary embodiment includes a plurality of bit lines 310, a plurality of word lines 320, a memory cell 330, and a dummy memory cell 350.

In the memory cell array 300, a plurality of bit lines 310 and a plurality of word lines 320 intersect and memory cells 330 are disposed at the intersections of the bit lines 310 and the word lines 320. Here, the memory cell 330 refers to a phase change memory cell and includes an access element 332 and a resistive element 334. Each of the access element 332 and the resistive element 334 may be configured by a lower electrode, a phase change material layer, and an upper electrode. Here, a phase change material layer which configures the access element 332 and a phase change material layer which configures the resistive element 334 may be different types of materials layers.

Referring to FIG. 1A, the memory cell is located at the intersection of the plurality of bit lines 310 and the plurality of word lines 320 and the dummy memory cell 350 is located at the intersection of the plurality of bit lines 310 and the dummy word line $WLD_{ummy}$.

In the meantime, referring to FIG. 1B, a dummy memory cell 352 is located at the intersection of the plurality of word lines 320 and the dummy bit line $BL_{Dummy}$.

Here, an operation of the sensing circuit 200 and the memory cell array 300 will be described.

The sensing circuit 200 supplies a sensing current to the cross point array 300 by means of the bit line.

The sensing circuit 200 supplies a sensing current to the cross point array 300 to read data stored in the memory cell 330 during a read operation. The sensing circuit 200 compares $I_{read}$ and $I_{ref}$ to determine a state of the memory cell 330 (cell state). Here, the sensing circuit 200 may operate in two steps.

In a first step, an operation of sampling a sneak current is performed and in a second step, an operation of canceling a sneak current and reading data is performed.

In FIG. 1A, in the first step, the first switch circuit MN1, the second switch circuit MN3, and the third switch circuit MN4 are turned on by the first operation control signal and the third switch circuit MN4 is turned on by the second operation control signal. In that state, the bit line current $I_{BL}$ is supplied to a selected bit line of the cross point array 300 and a reference current $I_{ref}$ flowing through the reference resistor $R_{ref}$ is also supplied. In FIG. 1B, the first switch circuit MN1, the second switch circuit MN3, the third switch circuit MN4, and the fourth switch circuit MN6 are turned on by the first operation control signal and the fifth switch circuit MN5 is turned on by the second operation control signal. In that state, the bit line current $I_{BL}$ is supplied to a selected bit line of the cross point array 300 and a reference current $I_{ref}$ flowing through the reference resistor $R_{ref}$ is also supplied. Here, the selected bit line refers to a predetermined bit line which is selected by the control of the first operation control signal and the second operation control signal and the unselected bit line refers to a predetermined bit line which is not selected by the control of the first operation control signal and the second operation control signal. For example, in FIG. 1A, when a N-th bit line is selected, the selected bit line may be BLN and when the first bit line is not selected, the unselected bit line may be BL1.

In the first step, a word line of the dummy memory cell 350 is selected and the bit line current $I_{BL}$ is supplied to the selected bit line of the selected dummy memory cell 350. In the first step, the word line of the cell array 340 is not selected, but may be floated or biased by V/2.

In the floating scheme, in the first step, a sneak current which flows to the floated cell array 340 excluding the dummy memory cell 350 is sampled and stored. Equations 1 and 2 correspond to sneak currents sampled when a dummy word line is used and when a dummy bit line is used, respectively.

$$I_{HRS}+I_{sneak}=I_{HRS}+M*I_{S\_Cell}=I_{HRS}+(N-1)*I_{S\_HRS} \quad \text{[Equation 1]}$$

$$I_{HRS}+I_{Sneak}=I_{HRS}+N*I_{S\_cell}=I_{HRS}+(M-1)*I_{S\_HRS} \quad \text{[Equation 2]}$$

($I_{HRS}$: a high resistive state current flowing in a dummy memory cell 350 of a selected bit line, $I_{sneak}$: a sneak current, $I_{S\_Cell}$: a current flowing in a memory cell 330 of a selected bit line or word line in a floated state, $I_{S\_HRS}$: a high resistive state current flowing in a dummy memory cell 350 of a unselected bit line or word line, M: a number of word lines, N: a number of bit lines)

In the V/2 scheme, in the first step, a sneak current which flows to the floated cell array 340 excluding the dummy memory cell 350 is sampled and stored. Equations 3 and 4 correspond to sneak currents sampled when a dummy word line is used and when a dummy bit line is used, respectively.

$$I_{HRS}+I_{Sneak}=I_{HRS}+M*I_{H\_cell} \quad \text{[Equation 3]}$$

$$I_{HRS}+I_{Sneak}=I_{HRS}+(M-1)*I_{H\_HRS} \quad \text{[Equation 4]}$$

($I_{HRS}$: a high resistive state current flowing in a dummy memory cell 350 of a selected bit line, $I_{sneak}$: a sneak current, $I_{H\_cell}$: a current in a V/2 biased state flowing in a memory cell 330 of a selected bit line, $I_{H\_HRS}$: a high resistive state current in a V/2 biased state flowing in a dummy memory cell 350 of a unselected bit line, M: a number of word lines, N: a number of bit lines)

In the floating scheme, when the dummy word line is used, in the second step, the first switch circuit MN1 and the second switch circuit MN3 are turned off by the first operation control signal and the third switch circuit MN4 is turned on by the second operation control signal. In that state, the bit line current IBL is supplied to the same bit line of the cross point array 300 selected in the first step.

In the second step, the selected bit line supplies a bit line current $I_{BL}$ to a bit line selected to read a selected cell.

In the floating scheme, when the dummy bit line is used, in the second step, the first switch circuit MN1, the second switch circuit MN3, and the fourth switch circuit MN6 are turned off by the first operation control signal and the fifth switch circuit MN5 is turned on by the second operation control signal. In that state, the bit line current $I_{BL}$ is supplied to the same word line of the cross point array 300 selected in the first step.

In the second step, the selected bit line supplies a bit line current $I_{BL}$ to a bit line selected to read a selected cell. In the second step of the floating scheme, the sensing circuit 200 reads and senses the bit line current $I_{BL}$ flowing in the selected word line and the unselected word line in the floated state.

In the V/2 scheme, when the dummy word line is used, in the second step, the first switch circuit MN1 and the second switch circuit MN3 are turned off by the first operation control signal and the third switch circuit MN4 is turned on by the second operation control signal. In that state, the bit line current $I_{BL}$ is supplied to the same bit line of the cross point array 300 selected in the first step.

In the second step, the selected bit line supplies a bit line current $I_{BL}$ to a bit line selected to read a selected cell.

In the V/2 scheme, when the dummy bit line is used, in the second step, the first switch circuit MN1, the second switch circuit MN3, and the fourth switch circuit MN6 are turned off by the first operation control signal and the fifth switch circuit MN5 is turned on by the second operation control signal. In that state, the bit line current $I_{BL}$ is supplied to the same word line of the cross point array 300 selected in the first step.

In the second step, the selected bit line supplies a bit line current $I_{BL}$ to a bit line selected to read a selected cell. In the second step of the V/2 scheme, the sensing circuit 200 reads and senses the bit line current $I_{BL}$ flowing in the selected word line and the unselected word line in the V/2 biased state.

Here, since a target to be sensed is $I_{cell}$, when a sneak current $I_{sneak}$ sampled in the first step is subtracted from the bit line current $I_{BL}$ of the second step including the sneak current $I_{sneak}$, only $I_{cell}$ is may be sensed as compared with the reference current $I_{ref}$.

The sensing circuit 200 may determine a state of the memory cell 330 by the reference voltage $V_{ref}$ stored in the sampling capacitor 250. For example, when $V_{data} < V_{ref}$, the state is determined as a low resistance state LRS and when $V_{data} > V_{ref}$, the state is determined as a high resistance state HRS.

Figure 2:
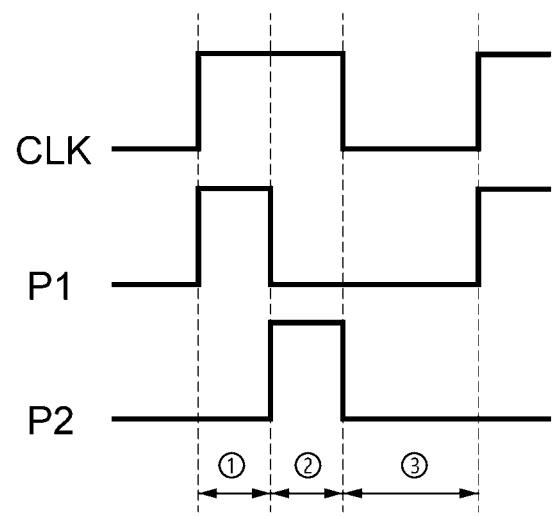
FIG. 2 is a view illustrating an operation control circuit of an offset cancelation sensing circuit according to an exemplary embodiment of the present disclosure.

FIG. 2 is a view illustrating an operation control circuit of an offset cancellation sensing circuit according to an exemplary embodiment of the present disclosure.

In FIG. 2, a CLK graph illustrates a CLK control signal which divides an operation of the circuit into an evaluation period and a precharge period and a P1 graph illustrates a first operation control signal for controlling operations of the first switch circuit MN1, the second switch circuit MN3, the third switch circuit MN4, and the fourth switch circuit MN6. Further, a P2 graph illustrates a second operation control signal for controlling operations of the third switch circuit MN4 and the fifth switch circuit MN5.

A period (1) refers to a period in which an operation of sampling a sneak current is performed and a period (2) refers to a period in which the sneak current is canceled and a read operation for a selected cell is performed. A period (3) refers to a period in which a precharge operation is performed.

In FIG. 2, the period (1) corresponds to the first step of the sensing circuit 200 and the period (2) corresponds to the second step of the sensing circuit 200.

Figure 3A:
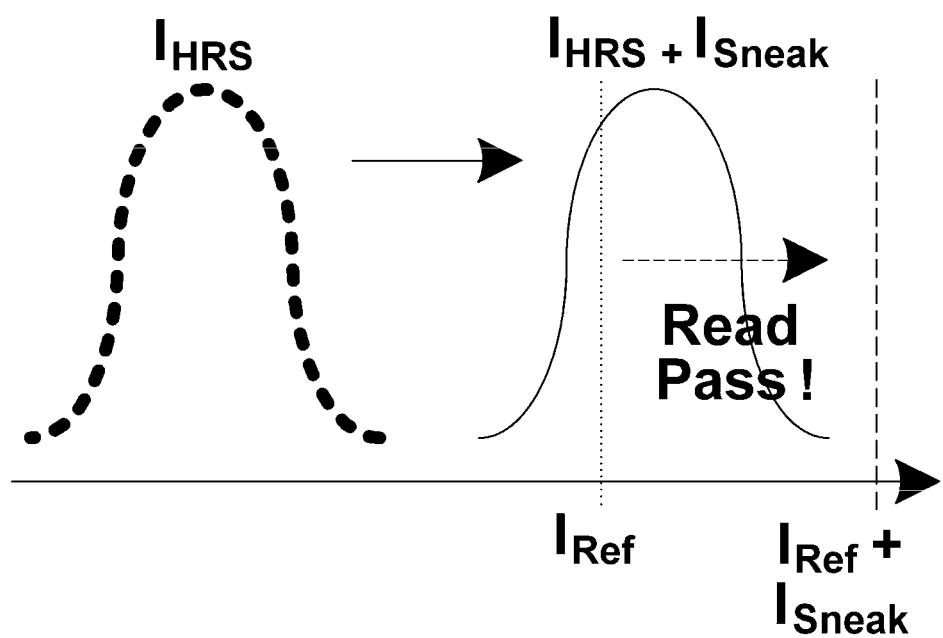

FIG. 3A and FIG. 3B are a view illustrating an operating step of a memory device according to an exemplary embodiment of the present disclosure.

The memory device 100 according to the present exemplary embodiment compares $I_{read}$ with $I_{ref}$ in the sensing circuit 200 to determine a state of the memory cell.

$$I_{ref}=(I_{HRS}+I_{LRS})/2,\ I_{read}=I_{HRS}\ or\ I_{LRS}(I_{sneak}=0)$$

In the related art, the read failure problem occurs in HRS.

In the related art, when $I_{ref} > I_{read} = I_{HRS}$, the state is properly recognized, but due to $I_{sneak}$, the read failure occurs.

Referring to FIG. 3A, when $I_{sneak}$ is compensated by $I_{ref}$ in the sensing circuit 200, the sneak current of the unselected memory in a random state in the array may be sampled.

Generally, the variation of $I_{HRS}$ occurs, and the variation of $I_{HRS}$ may be more significant due to the offset voltage of the sensing circuit 200.

Referring to FIG. 3B, the sensing circuit 200 according to the present exemplary embodiment cancels the offset voltage to minimize the variation of $I_{HRS}$, thereby minimizing a real failure probability.

FIGS. 4A to 4J are views for explaining an operation of a cross-point array according to an exemplary embodiment of the present disclosure.

FIGS. 4A to 4J illustrate a M×N memory cell array 300 (WL×BL).

Figure 4A:
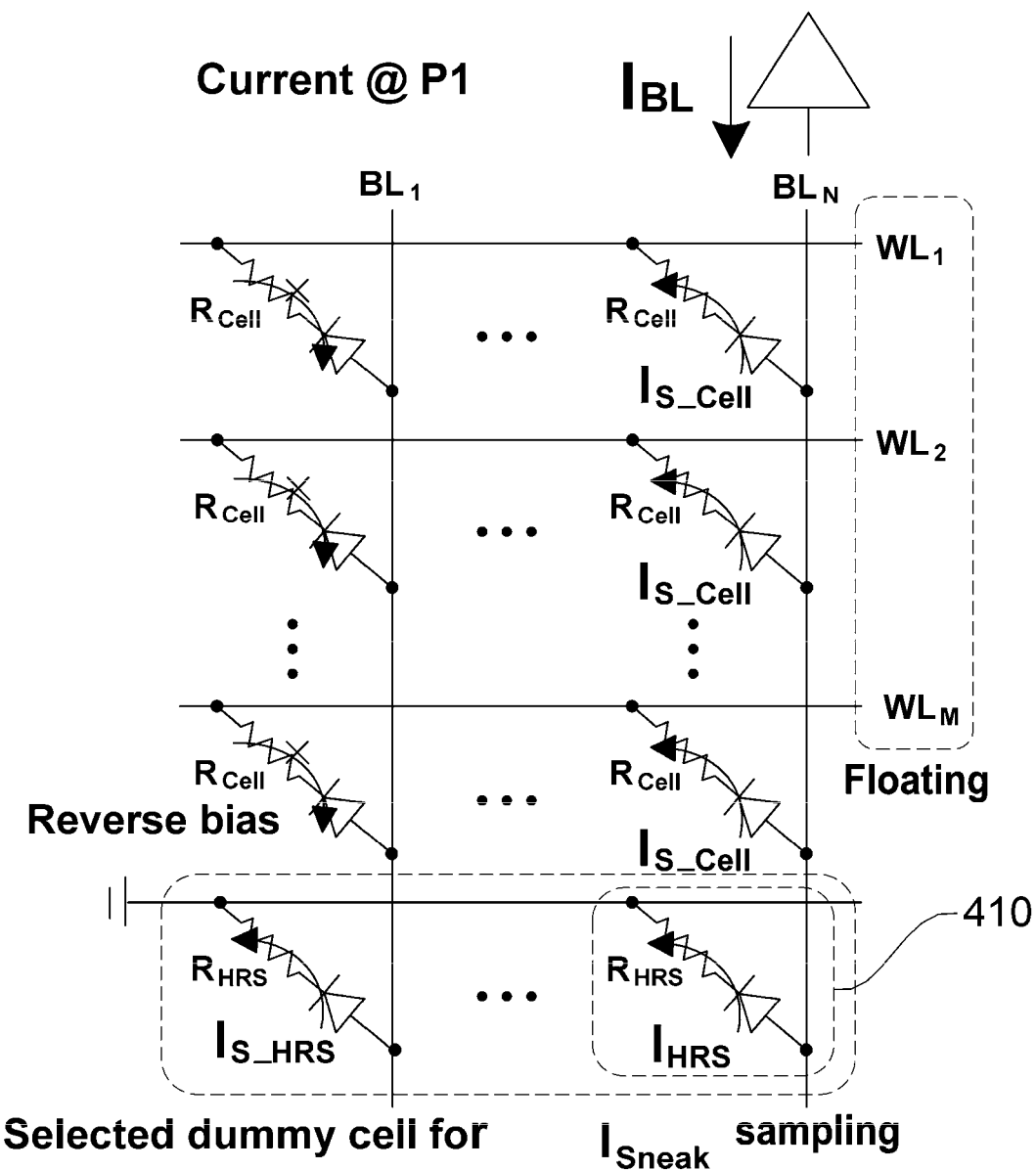
FIGS. 4A to 4J are views for explaining an operation of a cross-point array according to an exemplary embodiment of the present disclosure.

In FIG. 4A, the sensing circuit 200 of the memory device 100 samples and stores $I_{sneak}$ which flows to the dummy word line and the unselected word line in a floated state.

Figure 4B:
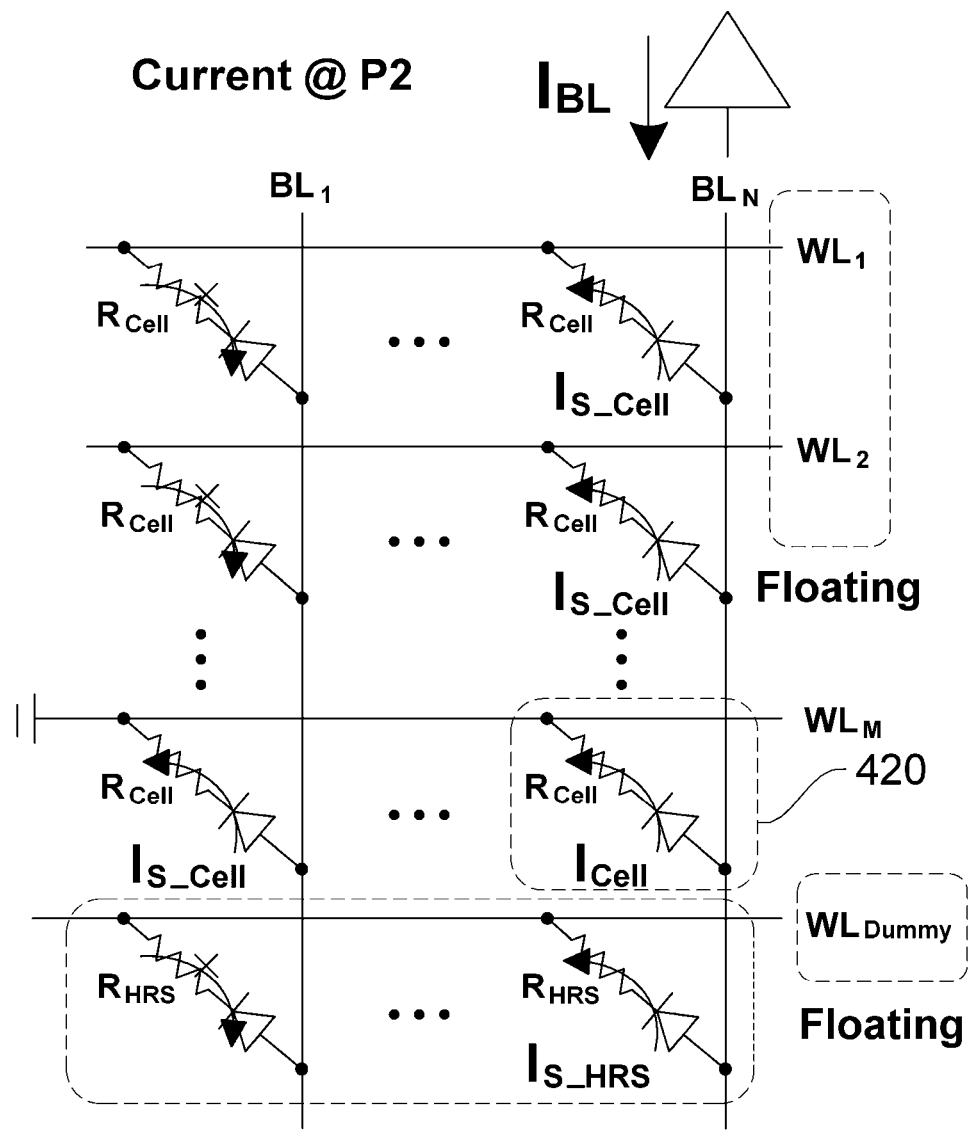

In FIG. 4B, the sensing circuit 200 of the memory device 100 reads and senses $I_{BL}$ which flows to the selected word line and the unselected word line in a floated state.

Figure 4C:
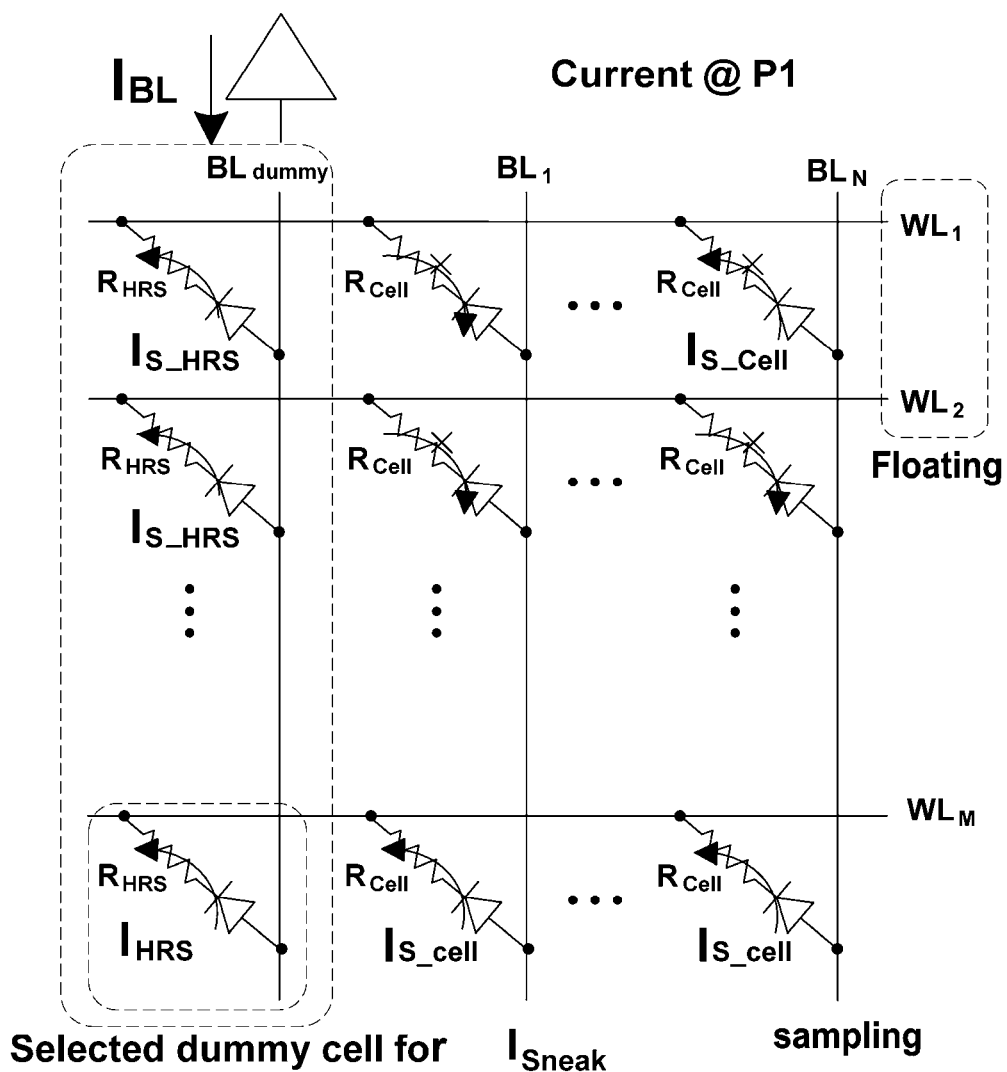

In FIG. 4C, the sensing circuit 200 of the memory device 100 samples and stores $I_{sneak}$ which flows to the selected word line connected to the dummy bit line and the unselected word line in a floated state.

Figure 4D:
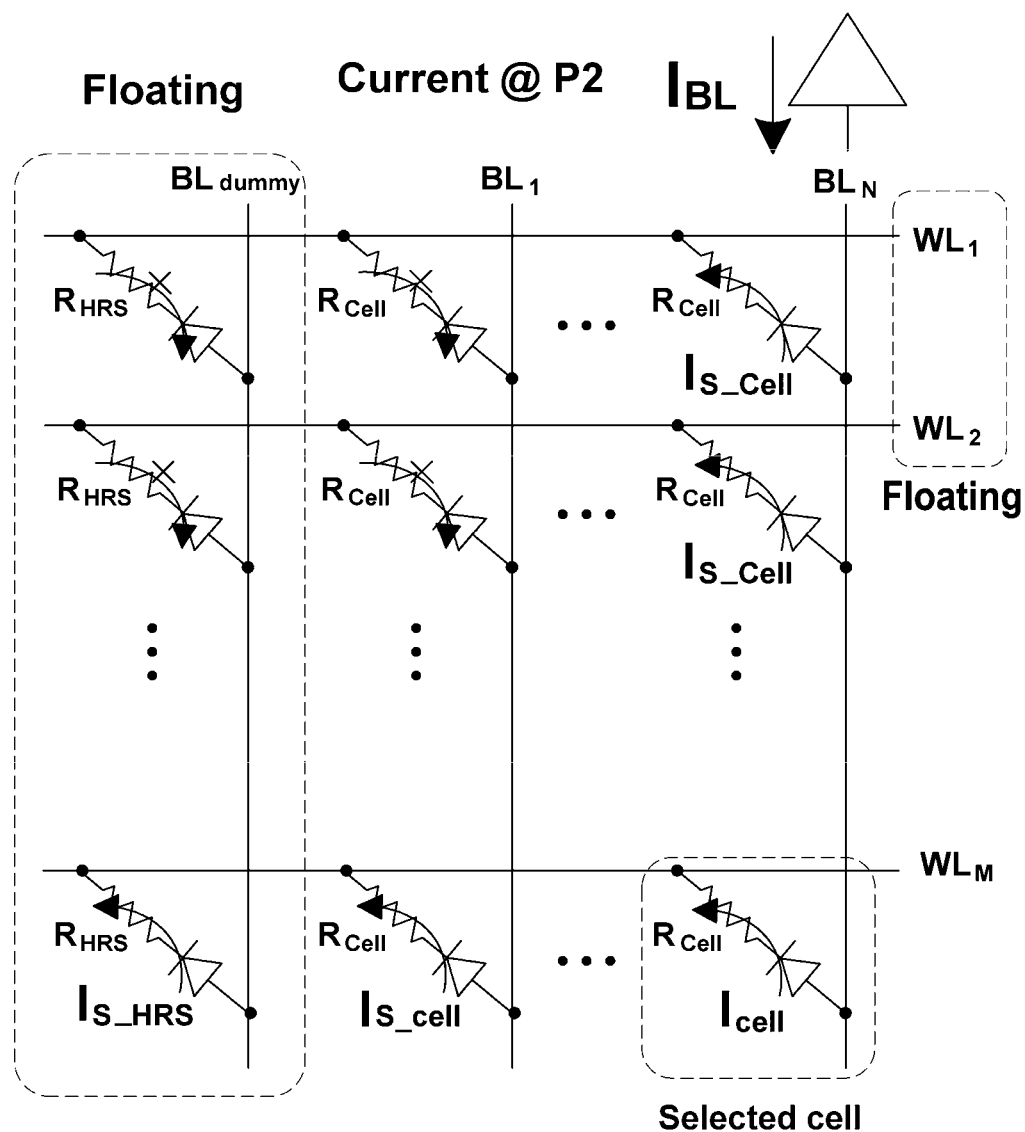

In FIG. 4D, the sensing circuit 200 of the memory device 100 reads and senses $I_{BL}$ which flows to the selected word line connected to the selected bit line and the unselected word line in a floated state.

Figure 4E:
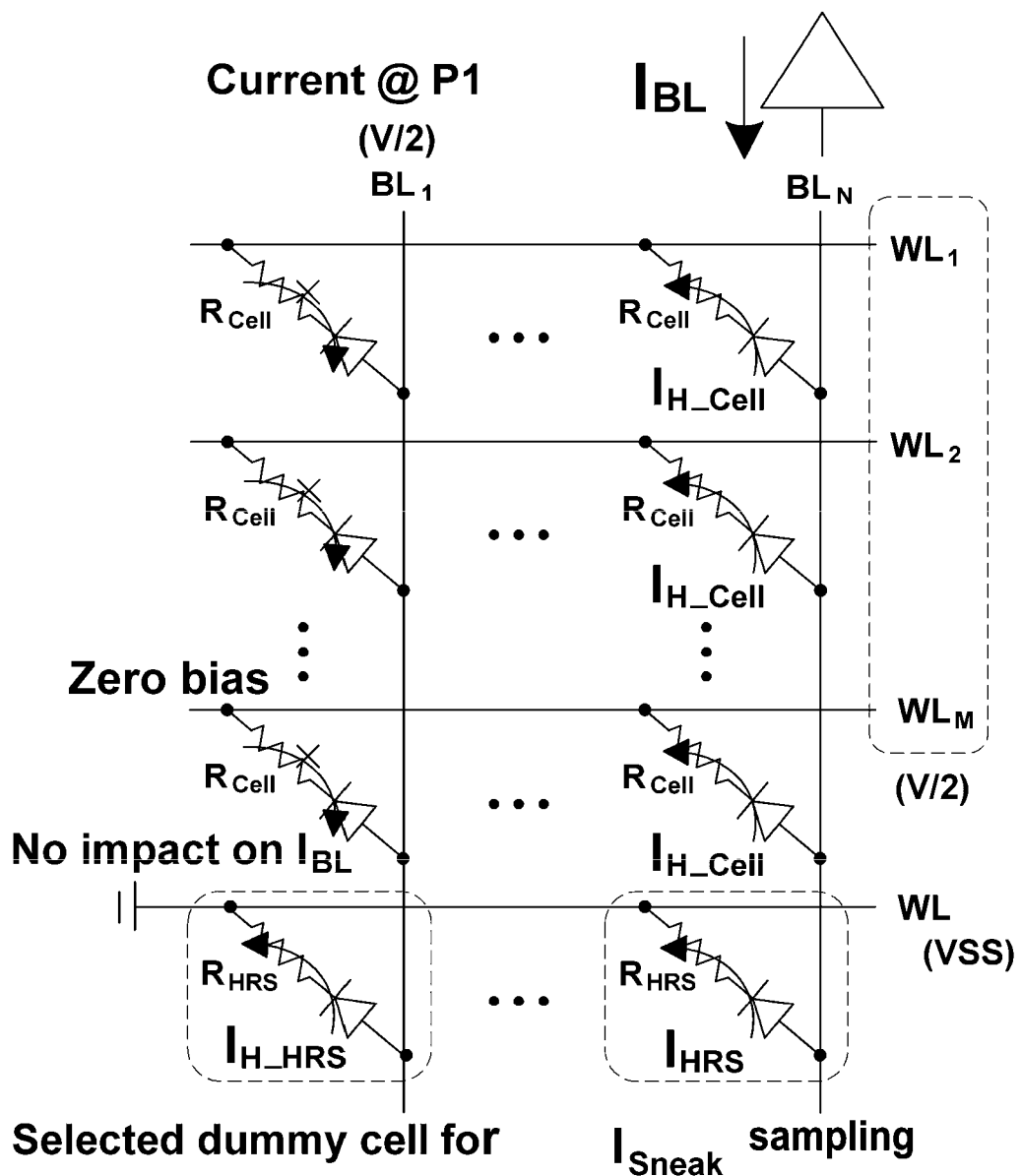

In FIG. 4E, the sensing circuit 200 of the memory device 100 samples and stores $I_{sneak}$ which flows to the dummy word line and the unselected word line in a V/2 biased state.

Figure 4F:
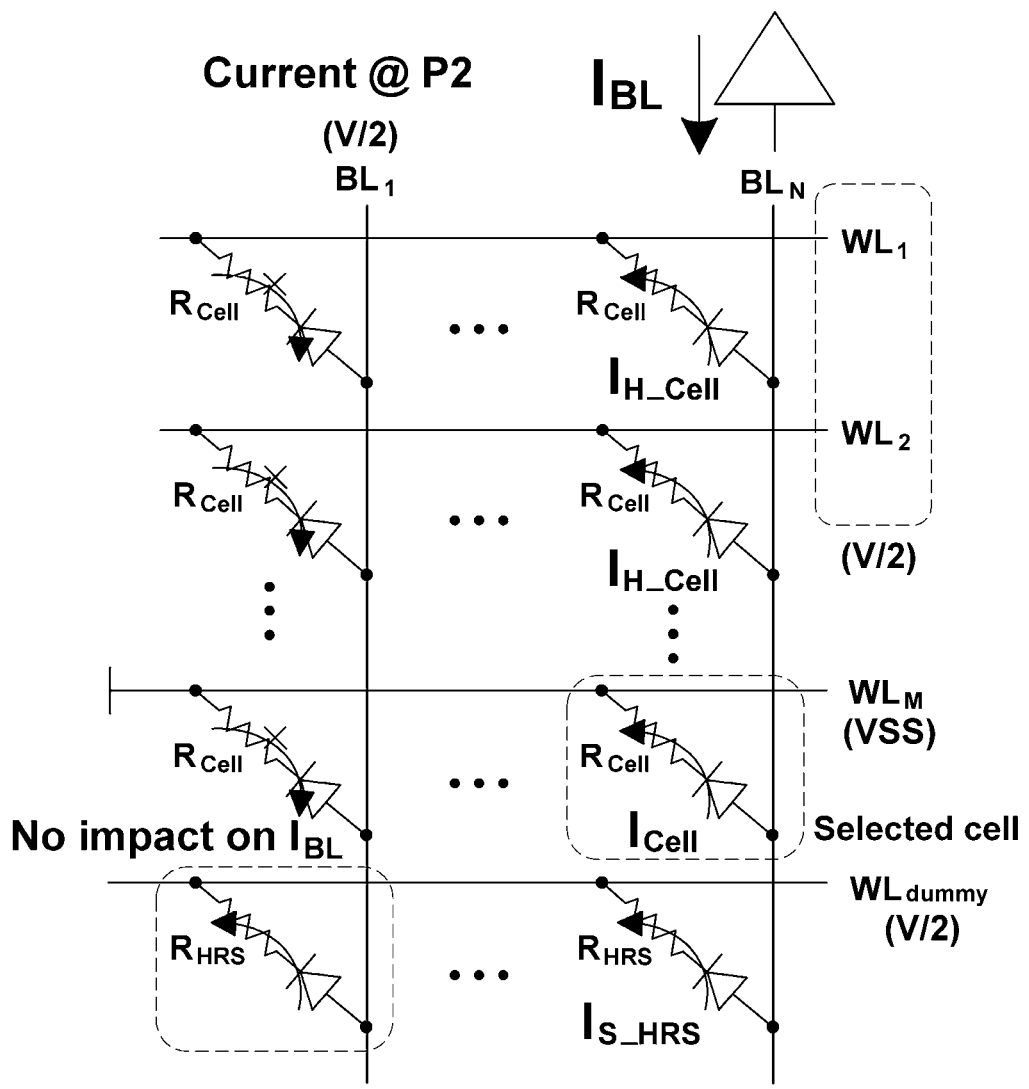

In FIG. 4F, the sensing circuit 200 of the memory device 100 reads and senses $I_{BL}$ which flows to the selected word line and the unselected word line in a V/2 biased state.

Figure 4G:
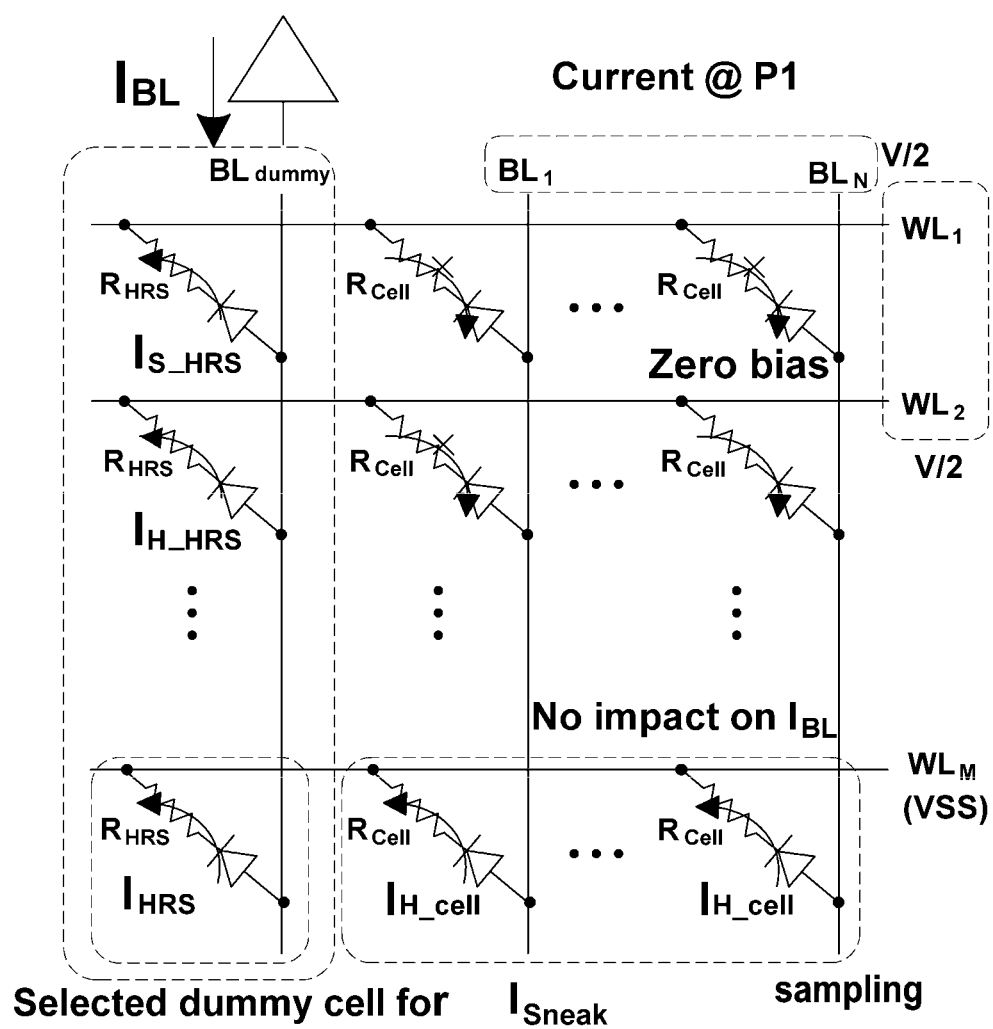

In FIG. 4G, the sensing circuit 200 of the memory device 100 samples and stores $I_{sneak}$ which flows to the selected word line connected to the dummy bit line and the unselected word line in a V/2 biased state.

Figure 4H:
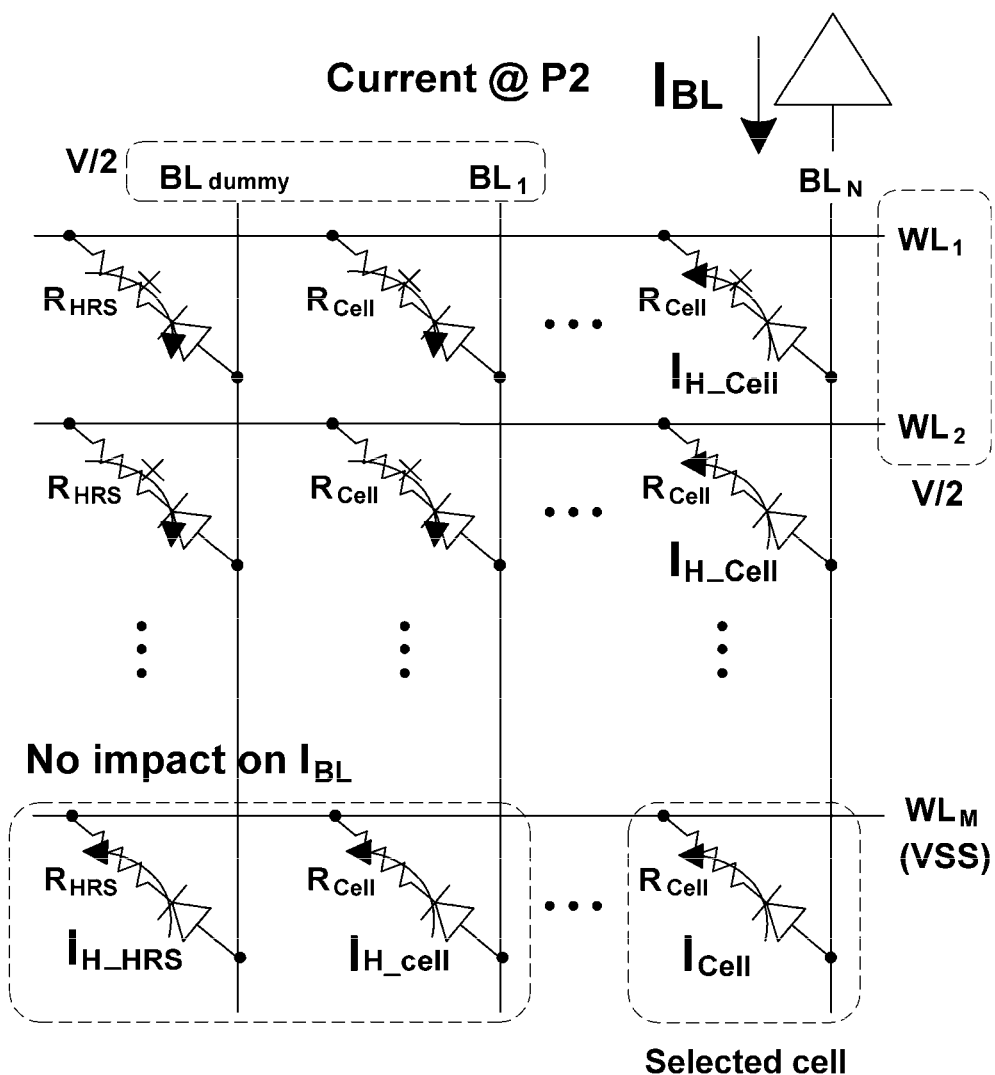

In FIG. 4H, the sensing circuit 200 of the memory device 100 reads and senses $I_{BL}$ which flows to the selected word line connected to the dummy bit line and the unselected word line in a V/2 biased state.

Since a target to be sensed by the sensing circuit 200 is $I_{cell}$, when sampled $I_{sneak}$ is subtracted from $I_{BL}$, only $I_{cell}$ may be sensed.

Figure 4I:
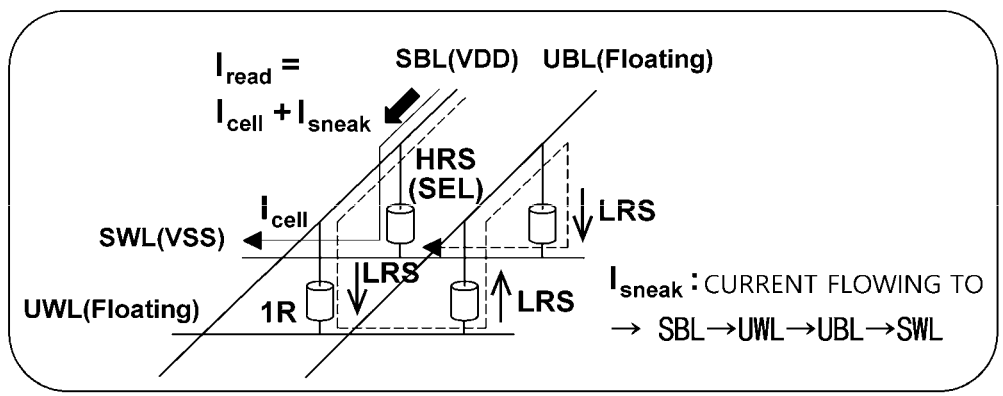
Figure 4J:
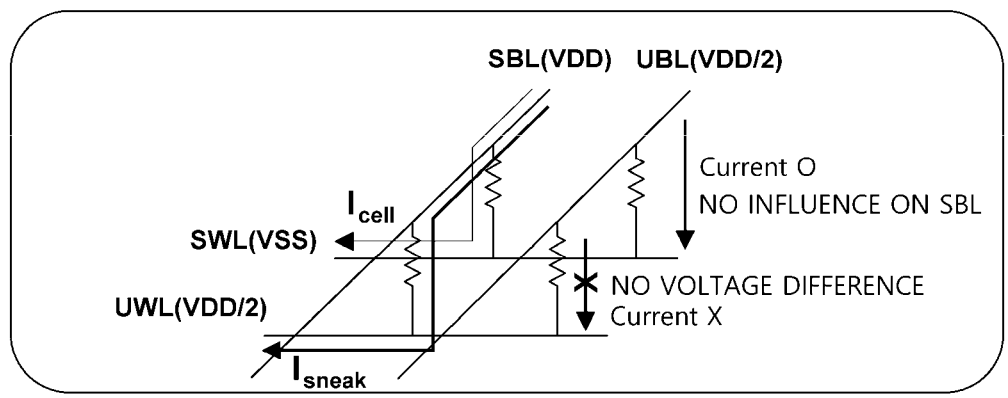

FIG. 4I and FIG. 4j are a view illustrating a path where $I_{cell}$ and $I_{sneak}$ flow in the memory cell array 300.

Figure 5A:
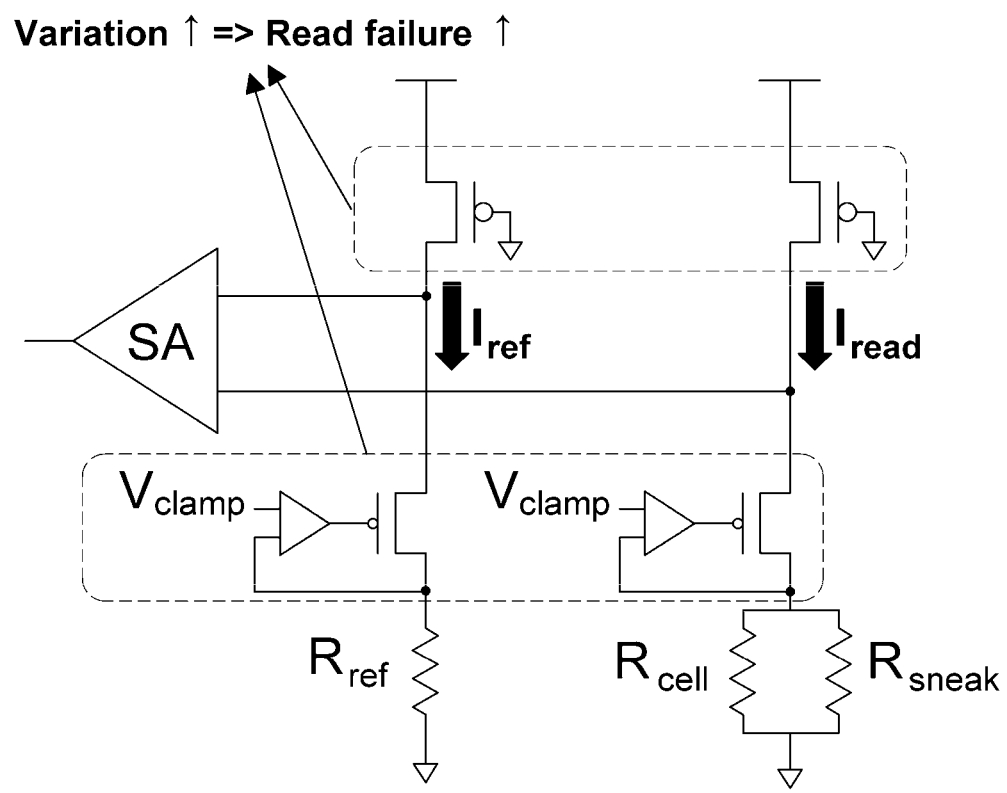
FIG. 5A and FIG. 5B are a view for explaining an operation of an offset cancellation sensing circuit according to an exemplary embodiment of the present disclosure.
Figure 5B:
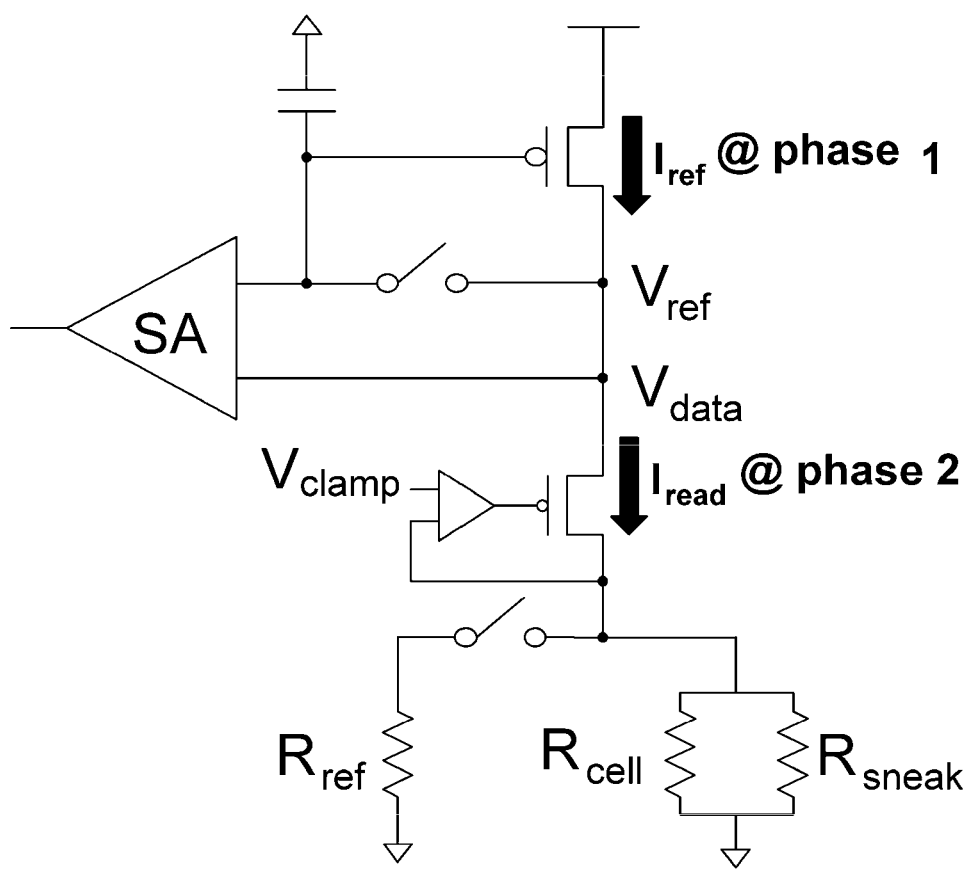

FIG. 5A and FIG. 5B are a view for explaining an operation of an offset cancellation sensing circuit according to an exemplary embodiment of the present disclosure.

FIG. 5A illustrates a sensing circuit of the related art and in the sensing circuit of the related art, a transistor TR of a $I_{ref}$ path and a transistor TR of an $I_{read}$ path are not the same, which may cause the read failure due to the threshold value variation $V_{th}$ variation.

FIG. 5B illustrates a sensing circuit of the present disclosure and in the sensing circuit of the present disclosure, a transistor TR of a $I_{ref}$ path and a transistor of an $I_{read}$ path are the same, so that the read failure due to the threshold value variation $V_{th}$ variation is minimized.

Figure 6A:
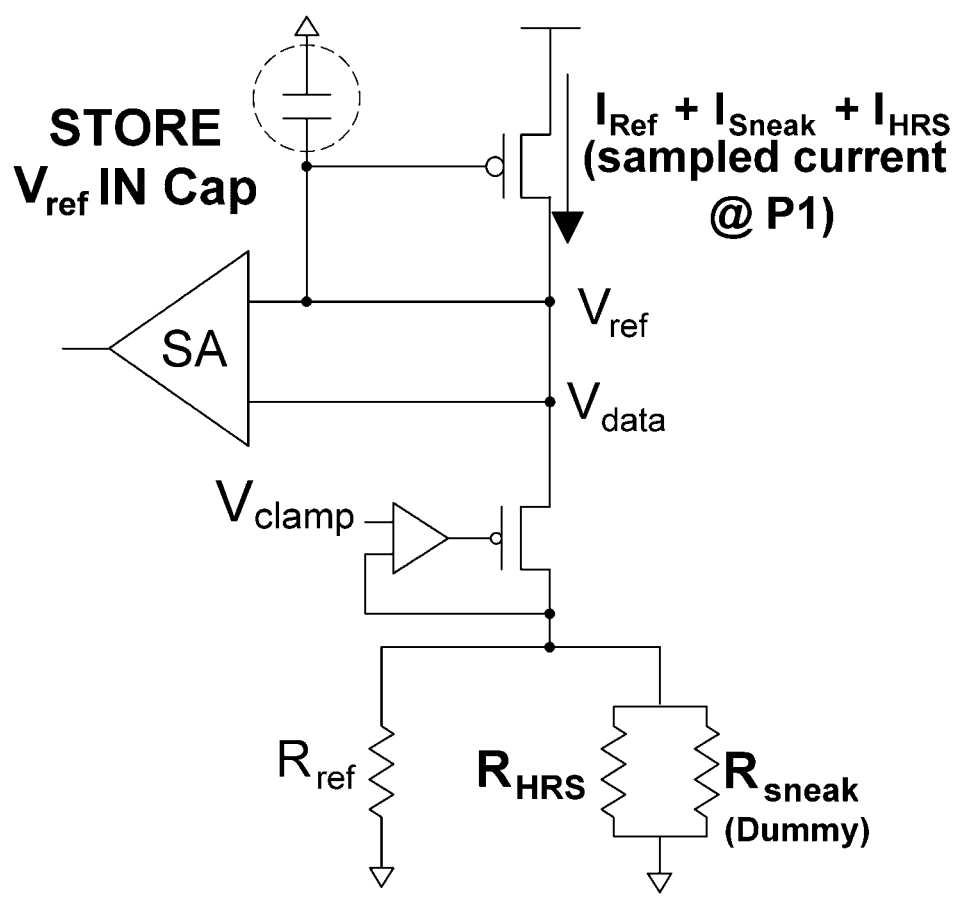
FIG. 6A and FIG. 6B are a view illustrating an operation step of an offset cancellation sensing circuit according to an exemplary embodiment of the present disclosure.
Figure 6B:
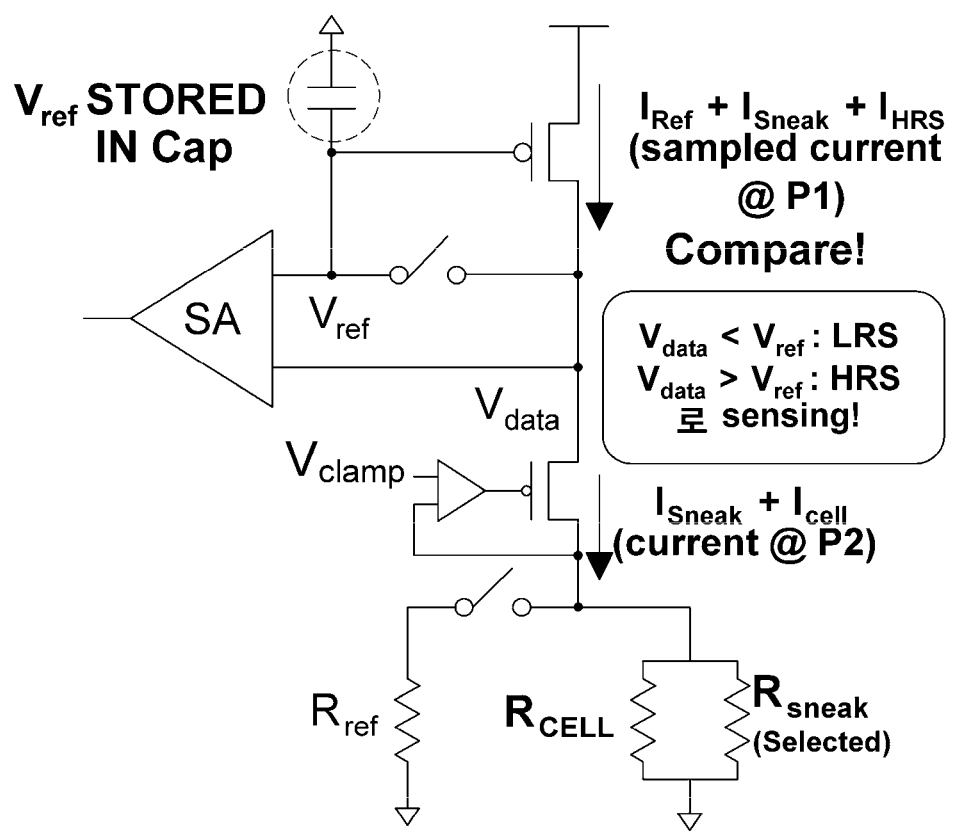

FIG. 6A and FIG. 6B are a view illustrating an operation step of an offset cancelation sensing circuit according to an exemplary embodiment of the present disclosure.

FIG. 6A illustrates an operation of the sensing circuit 200 in a first step and FIG. 6B illustrates a step of the sensing circuit 200 in a second step.

Referring to FIG. 6A, in the sensing circuit 200, in the first step, two switches (a first switch circuit and a second switch circuit) are controlled to be turned on by a first operation control signal. In the memory cell array 300, the dummy word line or the dummy bit line is turned on by the switching control of the sensing circuit 200.

Referring to FIG. 6B, in the sensing circuit 200, in the second step, two switches (a first switch circuit and a second switch circuit) are controlled to be turned off by a first operation control signal. At this time, $V_{data}$ may be determined by comparing a current in the first step (a first bit line current) and a current in the second current (a second bit line current) by the reference voltage Vref stored in the sampling capacitor 250 of the sensing circuit 200.

Figure 7:
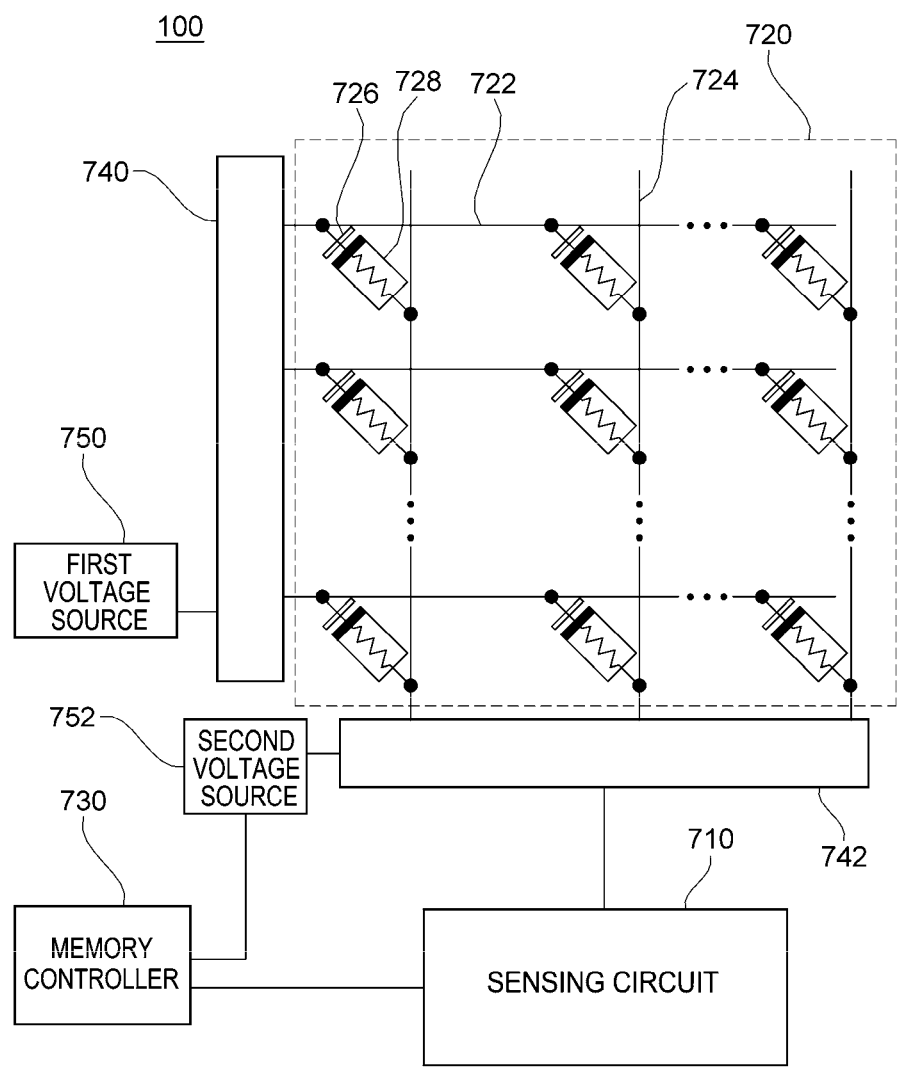
FIG. 7 is a view illustrating a memory device according to another exemplary embodiment of the present disclosure.

FIG. 7 is a view illustrating a memory device according to another exemplary embodiment of the present disclosure.

FIG. 7 is a circuit diagram of a memory device 200 in which an output signal is sensed by the crossbar array 720 according to an example of the principle described in the present disclosure. The crossbar array 720 may include a plurality of first lines 722, a plurality of second lines 724, a plurality of memory elements 728, such as a memristor, and a plurality of selectors 726 which is connected to the memory element 728 in series, such as a non-linear selector.

The memory device 100 further includes a first line selector 740. The first line selector 740 selectively couples a different first line 722 to a first voltage source 750 to transmit a plurality of voltages to the first lines 722. The first line selector 740 may include a decoder and a driver circuit to selectively couple the first voltage source 750 to a different first line 722. An example of a voltage which may be supplied by the first voltage source 750 includes a part of a selected voltage applied to a target first line 722 related to a target memory element 728. Apart of the selected voltage applied to the target first line 722 (see FIG. 2) related to the target memory element 728 may be an overall selected voltage. The first voltage source 750 may transmit a part of a non-selected voltage to the first line 722 which does not correspond to the target memory element 728. The first voltage source 750 may be coupled to the memory controller 730 indicating which voltage value is supplied to which first line 722.

The memory device 100 further includes a second line selector 742. The second line selector 742 selectively couples a different second line 724 to the second voltage source 752 to transmit a plurality of voltages to the second line 724. The second line selector 742 may include a decoder and a driver circuit to selectively couple the second voltage source 752 to a different second line 724. An example of a voltage which may be supplied by the second voltage source 752 includes a part of a selected voltage applied to a target second line 724 related to a target memory element 728. In some examples, when the entire selected voltage is applied by the first target line 722 related to the target memory element 728, the target second line 724 related to the target memory element 728 may be grounded. The second voltage source 752 may transmit a part of a non-selected voltage to the second line 724 which does not correspond to the target memory element 728. The second voltage source 752 may be coupled to the memory controller 730 indicating which voltage value is supplied to which second line 724.

The memory device 100 further includes a sensing circuit 710 which senses an output current from the cross bar array 720. Specifically, the output current is collected along the second line 724 of the crossbar array 720. Accordingly, the sensing circuit 710 may be coupled to the second line 724 to receive an output current. The sensing circuit 710 may include a switch which selectively couples the remaining part of the sensing circuit 710 to the crossbar array 720. For example, during the sensing period, the switch may be closed so that the sensing circuit 710 collects and outputs a detected current such as a target output. In contrast, during a period other than the sensing period, the switch is open so that the sensing circuit 710 does not collect and output a current such as a sneak current.

The sensing circuit 710, and more particularly, a switch may be controlled by a memory controller 730 which receives an executable instruction representing a time to open or close the switch. The switch makes the sensing circuit 710 disabled so that the received sneak current is not passed and the detection of the target output is not confused.

Figure 8:
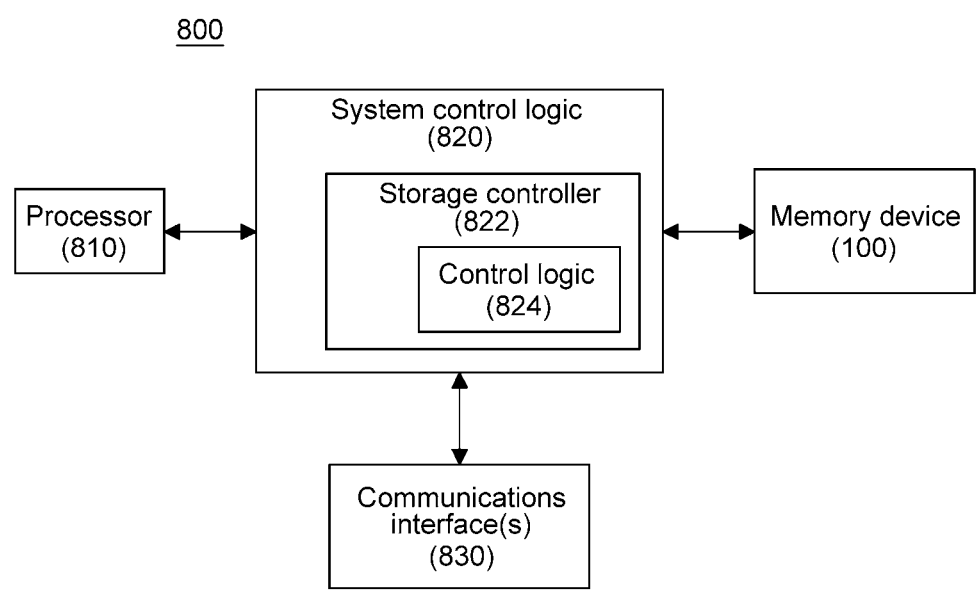
FIG. 8 is a view illustrating a system including a memory device according to an exemplary embodiment of the present disclosure.

FIG. 8 is a view illustrating a system including a memory device according to an exemplary embodiment of the present disclosure.

FIG. 8 illustrates an exemplary system 800 including a system control logic 820 coupled to at least one processor 810 according to an exemplary embodiment, a semiconductor memory device 100 coupled to the system control logic 820, and one or more communication interfaces 830 coupled to the system control logic 820.

The communication interface 830 may provide an interface for a system to communicate with other appropriate devices by means of one or more networks. The communication interface 830 may include any suitable hardware and/or firm ware. The communication interface 830 according to an exemplary embodiment, for example, may include a network adaptor, a wireless network adaptor, a telephone modem, and/or a wireless modem. The communication interface 830 according to the exemplary embodiment may use one or more antennas for wireless communication.

At least one of the processors 810 according to the exemplary embodiment may be packaged together with a logic for one or more controllers of the system control logic 820. According to an exemplary embodiment, at least one of the processors 810 may be packaged together with a logic for one or more controllers of the system control logic 820 to form a system in package (SiP).

According to an exemplary embodiment, at least one of the processors 810 may be integrated on the same die together with a logic for one or more controllers of the system control logic 820.

According to an exemplary embodiment, at least one of the processors 810 is integrated on the same die together with a logic for one or more controllers of the system control logic 820 to form a system in package (SiP).

The system control logic 820 according to the exemplary embodiment may include any suitable interface controllers which provide any suitable interface to any suitable device or component which communicates with at least one of the processors 810 and/or the system control logic 820.

The system control logic 820 according to the exemplary embodiment may include a storage controller 822 which provides an interface for controlling various access operations such as set, reset, and read operations, but is not limited thereto, to the semiconductor memory device 100. The storage controller 822 may include a control logic 824 which is specifically configured to control the semiconductor memory device 100. The control logic 824 may further generate various selection signals to control drivers, level shifters, and global selectors. According to various exemplary embodiments, the control logic 824 may be commands stored in a non-transitory computer readable medium to allow a storage controller to perform the above-mentioned operations when the commands are executed by at least one of the processors 810.

According to various exemplary embodiments, the system 800 may be a desktop computing device, a laptop computing device, or a mobile computing device (for example, a smart phone or a tablet). The system 800 may have more or less components and/or different architectures.

It will be appreciated that various exemplary embodiments of the present disclosure have been described herein for purposes of illustration, and that various modifications and changes may be made by those skilled in the art without departing from the scope and spirit of the present invention. Accordingly, the exemplary embodiments of the present disclosure are not intended to limit but describe the technical spirit of the present invention and the scope of the technical spirit of the present invention is not restricted by the exemplary embodiments. The protective scope of the exemplary embodiment of the present invention should be construed based on the following claims, and all the technical concepts in the equivalent scope thereof should be construed as falling within the scope of the exemplary embodiment of the present invention.

What is claimed is:

1. A memory device, comprising:
   a memory cell array which includes a plurality of word lines and a plurality of bit lines intersecting each other and memory cells disposed at intersections of the word lines and the bit lines; and
   a sensing circuit which supplies a bit line current to all or some of the bit lines, cancels a sneak current based on the bit line current by at least one switching control, and senses and amplifies data stored in the memory cell to output the sensed and amplified data,
   wherein the memory cell array includes at least one dummy memory cell connected to a dummy word line to sample the sneak current, and
   wherein the sensing circuit operates in a first step or a second step by the switching control which operates by a first operation control signal and a second operation control signal, and the sensing circuit supplies a first bit line current for sampling the sneak current to the dummy memory cell in the first step and cancels the sneak current, and supplies a second bit line current for reading data stored in the memory cell to the dummy memory cell in the second step.

2. The memory device according to claim 1, wherein the sensing circuit supplies the first bit line current to the memory cell array in the first step in which the plurality of switches is controlled to be turned on by the first operation control signal and the second operation control signal, and the first bit line current includes a reference current, a sneak current, and a high resistive state (HRS) current.

3. The memory device according to claim 2, wherein the sensing circuit supplies the second bit line current to the memory cell array in the second step in which some of switches is controlled to be turned off by the first operation control signal and some of switches is controlled to be turned on by the second operation control signal, and the second bit line current includes a cell current and a sneak current and the sneak current is cancelled using the sneak current sampled in the first step.

4. The memory device according to claim 2, wherein the switch is at least one transistor TR which operates by the first operation control signal and the second operation control signal.

5. The memory device according to claim 1, wherein the sensing circuit is configured to include a current generation circuit, a clamping circuit, a first switch circuit, a sense amplifier, a sampling capacitor, and a bit line selecting circuit, and in the sensing circuit, one end of the current generation circuit is connected to the other end of the clamping circuit, a contact between the current generation circuit and the clamping circuit is connected to the sense amplifier, and the first switch circuit is connected between the contact between the current generation circuit and the clamping circuit and the sense amplifier.

6. The memory device according to claim 5, wherein in the sensing circuit, a contact between the sense amplifier and the first switch circuit is connected to a sampling capacitor, the sampling capacitor is connected to the ground, and a contact between the contact between the sense amplifier and the first switch circuit and the sampling capacitor is connected to the current generation circuit.

7. The memory device according to claim 6, wherein in the sensing circuit, the clamping circuit is connected to the bit line selecting circuit and the bit line selecting circuit includes a second switch circuit and a third switch circuit.

8. The memory device according to claim 7, wherein switching operations of the first switch circuit and the second switch circuit are controlled by the first operation control signal and a switching operation of the third switch circuit is controlled by the second operation control signal.

9. The memory device according to claim 8, wherein the sensing circuit supplies the first bit line current to the memory cell array in the first step in which the first switch circuit, the second switch circuit, and the third switch circuit are controlled by the first operation control signal and the second operation control signal to be turned on, and
   supplies the second bit line current to the memory cell array in the second step in which the first switch circuit and the second switch circuit are controlled by the first operation control signal to be turned off and the third switch circuit is controlled by the second operation control signal to be turned on.

10. The memory device according to claim 9, wherein the sensing circuit includes a precharge step in which the first switch circuit, the second switch circuit, and the third switch circuit are controlled by the first operation control signal and the second operation control signal to be turned off between the first step and the second step and performs a precharge operation in the precharge step.

* * * * *